(12) United States Patent
Parulkar et al.

(10) Patent No.: US 7,797,594 B1
(45) Date of Patent: Sep. 14, 2010

(54) BUILT-IN SELF-TEST OF 3-DIMENSIONAL SEMICONDUCTOR MEMORY ARRAYS

(75) Inventors: Ishwardutt Parulkar, San Francisco, CA (US); Sriram Anandakumar, Sunnyvale, CA (US); Krishna B. Rajan, Fremont, CA (US)

(73) Assignee: Oracle America, Inc., Redwood City, CA (US)

( * ) Notice: Subject to any disclaimer, the term of this patent is extended or adjusted under 35 U.S.C. 154(b) by 258 days.

(21) Appl. No.: 11/773,543

(22) Filed: Jul. 5, 2007

(51) Int. Cl.
*G11C 29/00* (2006.01)
*G01R 31/28* (2006.01)

(52) U.S. Cl. ..................... 714/719; 714/733
(58) Field of Classification Search .............. 714/718, 714/719, 733
See application file for complete search history.

(56) References Cited

U.S. PATENT DOCUMENTS

| | | | |
|---|---|---|---|
| 7,234,087 B2 * | 6/2007 | Tamura et al. .............. | 714/718 |
| 7,353,438 B2 * | 4/2008 | Leung et al. ................ | 714/720 |
| 7,356,746 B2 * | 4/2008 | Seema ........................ | 714/733 |
| 7,386,768 B2 * | 6/2008 | Vogt et al. .................. | 714/710 |
| 7,451,366 B2 * | 11/2008 | Youn et al. .................. | 714/718 |
| 2008/0016418 A1 * | 1/2008 | Evans et al. ................. | 714/718 |

OTHER PUBLICATIONS

Powell, et al., "BIST for Deep Submicron ASIC Memories with High Performance Application" IEEE International Test Conference, 2003.
Adams, R. Dean, "High Performance Memory Testing: Design Principles, Fault Modeling and Self-Test," Kluwer Academic Publishers, 2003, Chapter 9, pp. 128-148.
Adams, R. Dean, "High Performance Memory Testing: Design Principles, Fault Modeling and Self-Test," Kluwer Academic Publishers, 2003, Chapter 11, pp. 163-172.
Hamdioui, et al, "Testing Static and Dynamic Faults in Random Access Memories," IEEE VLSI Test Symposium, 2002, pp. 1-6.
van de Goor, A.J., "Testing Semiconductor Memories, Theory and Practice," John Wiley & Sons, Publisher, Chichester, U.K., 1998, pp. 341-423.

* cited by examiner

*Primary Examiner*—James C Kerveros
(74) *Attorney, Agent, or Firm*—Meyertons, Hood, Kivlin, Kowert & Goetzel, P.C.; Erik A. Heter

(57) ABSTRACT

A method and apparatus for testing a three dimensional (3D) memory including a static array and an active array. The method is performed by a memory built-in self-test (MBIST) controller, and includes writing data to the static array, transferring data from the static array to the active array, and reading data from the active array. The method further includes, in a plurality of subsequent cycles, writing data to the static array; transferring data from static array to the active array, and reading data from the active array, wherein said writing data for each subsequent cycle is performed concurrently with reading data for a previous cycle.

18 Claims, 5 Drawing Sheets

W = Write to Static Array
R = Read from Active Array
T = Transfer Data from Static Array to Active Array

BUILT-IN SELF-TEST OF 3-DIMENSIONAL SEMICONDUCTOR MEMORY ARRAYS

BACKGROUND OF THE INVENTION

1. Field of the Invention

This invention relates to integrated circuits, and more particularly, to the testing of 3-dimensional memory arrays implemented on an integrated circuit.

2. Description of the Related Art

Various types of memory arrays may be implemented on microprocessors and other types of integrated circuits. One type of memory array commonly used is a 3-dimensional (3D) memory array. A 3D memory array includes an active array and a static array. The active array includes both read and write ports, while the static array typically includes only a write port. Information may be written to the active area or read directly therefrom. In contrast, information cannot be directly read from the static array. Instead, reading the contents of the static array requires that data be transferred from the static array (via a transfer mechanism) to the active array, from which it is subsequently read.

Applications utilizing 3D memory arrays include storing thread-related information in multi-threaded processors and the storage of register history in processors configured for speculative execution, among others. In the first of these two applications, information pertaining to an active thread is stored in the active array, while information pertaining to a currently inactive thread is stored in the static array, to be transferred to the active array when the inactive thread becomes active. In the second of these two application, register file history may be stored in the static array and transferred to the active array if it is necessary for the processor to back up to a previous state (e.g., due to a branch misprediction).

Due to their organization, the testing of 3D memory arrays poses special problems. Since the static array of a 3D memory array does not have a read port, conventional memory tests cannot be performed. For example, many types of March tests (e.g., MATS, MATS+, MATS++, MarchC, MarchC-, MOVI, etc.) that are well known in the art require a write cycle immediately followed by a read cycle, followed by another write cycle immediately following the read cycle, and so forth. However, since data cannot be read directly from the static array, these tests cannot be performed in their conventional manner.

SUMMARY OF THE INVENTION

A method and apparatus for testing a three dimensional (3D) memory including a static array and an active array is disclosed. In one embodiment, the method is performed by a memory built-in self-test (MBIST) controller, and includes writing data to the static array, transferring data from the static array to the active array, and reading data from the active array. The method further includes, in a plurality of subsequent cycles, writing data to the static array; transferring data from static array to the active array, and reading data from the active array, wherein said writing data for each subsequent cycle is performed concurrently with reading data for a previous cycle.

In one embodiment, an integrated circuit includes a 3D memory having a static array, an active array, and a transfer mechanism. The active array includes a write port, a read port, and a transfer port from which the active array can receive data from the static array via a transfer mechanism. The static array includes a write port and a transfer port through which data can by transferred via the transfer mechanism to the active array. However, the static array does not include a read port, thus, reading the contents stored in the static array first requires a transfer to the active array.

The MBIST controller is configured to perform various types of tests on the static array, including a modified March test, where the March test can be one of several different types of well-known March tests. Testing may include first testing the active array to ensure its integrity, followed by testing of the static array. In performing the modified March test of the static array, writes for one cycle of the active array overlap with a read of data from the active array for a previous cycle. In other words, data is written to the static array, transferred to the active array, and read from the active array while concurrently writing data for the next cycle. In this manner, the timing of a conventional March test may be preserved despite the requirement of the extra step of transferring data from the active array to the static array.

BRIEF DESCRIPTION OF THE DRAWINGS

Other aspects of the invention will become apparent upon reading the following detailed description and upon reference to the accompanying drawings in which.

Figure 1:
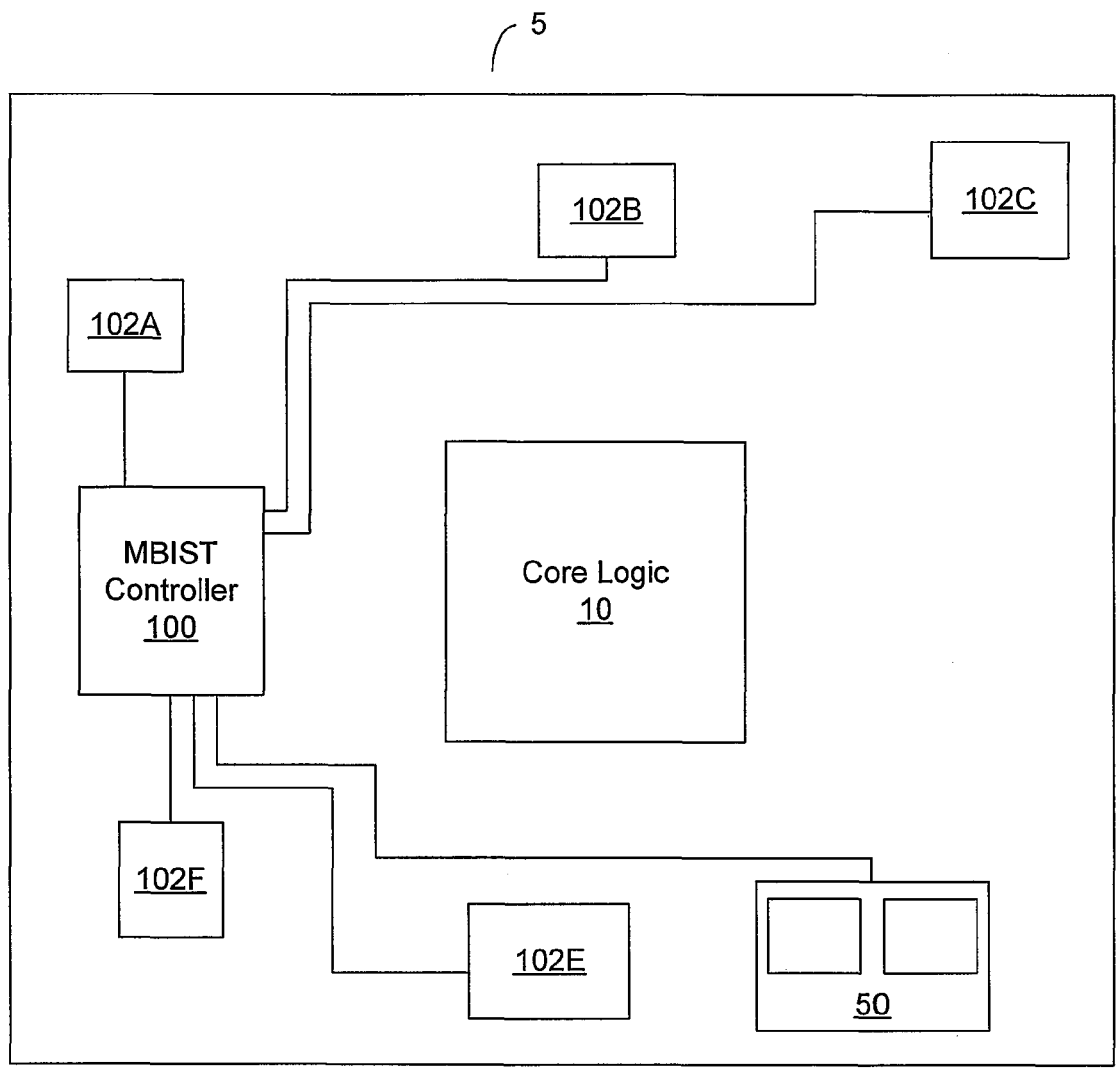
FIG. 1 is a drawing of one embodiment of an integrated circuit (IC) including a 3-dimensional (3D) memory array and an MBIST controller.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now FIG. 1, a drawing of one embodiment of an integrated circuit (IC) including a 3-dimensional (3D) memory and an MBIST controller is shown. In the embodiment shown, IC 5 includes core logic 10, which provides the basic functionality of the chip, which may be a processor, an application specific IC (ASIC), or other type. IC 5 also includes a plurality of memories, including memories 102A-102F, as well as 3D memory 50. Each of the memories may be used by various portions of the core logic to store information required for its operation.

IC 5 includes an MBIST (memory built-in self-test) controller 100 coupled to each of the memories implemented thereon. MBIST controller 100 is configured to test each of the memories 102 and 3D memory 50. The types of tests that may be conducted by MBIST controller 100 on the various memories include various well-known March tests, as a well as modified March tests that may be conducted on 3D memory 50, as will be discussed in further detail below.

Figure 2:
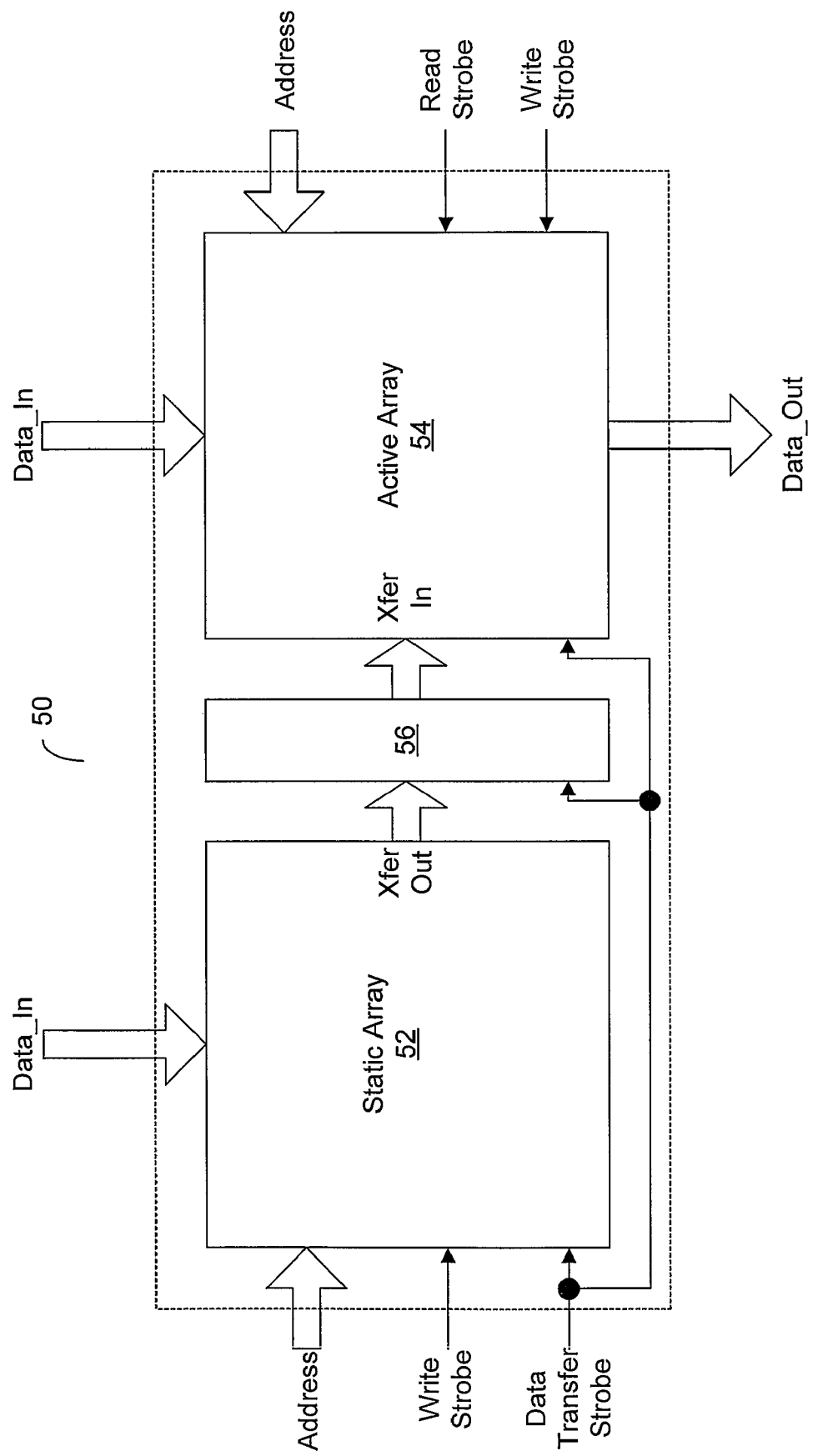
FIG. 2 is a block diagram of one embodiment of a 3D memory array implemented on the IC illustrated in FIG. 1.

FIG. 2 is a block diagram of one embodiment of a 3D memory implemented on the IC illustrated in FIG. 1. Other 3D memories with configurations different than that shown in FIG. 2 are possible and contemplated. In the embodiment shown, 3D memory includes a static array 52 and an active array 54, with a transfer mechanism 56 coupled therebetween. Static array 52 and active array 54 each includes a write port (Data_In) through which data can be written to its respective array. Data may be written to a selected address when the write strobe signal is active for the respective array.

Each of the arrays, both static and active, also include an address port (Address) which allows an address to be provided to the respective array during write operations, and in case of active array 54, during read operations as well. Active array 54 is also coupled to receive a read strobe signal, that, when active, enables a read operation.

Active array 54 includes a read port (Data_Out), which allows data to be read directly from the array. In contrast, static array 52 does not include a read port, and thus data cannot be read directly therefrom. In order to read data from static array 52, it must first be transferred to the active array. This is performed by transfer mechanism 56, which is configured to retrieve data from static array 52 (through transfer port Xfer_Out) and convey the retrieved data to active array 54 (via transfer port Xfer_In). In the embodiment shown, transfer mechanism may be configured to convey data from static array 52 to active array 54 on a location-by-location basis, or may transfer the entire contents of static array 52 to active array 54. In order to conduct a transfer of data from static array 52 to active array 54, a data transfer strobe signal is asserted. Upon assertion of this signal, which is received by static array 52, active array 54, and transfer mechanism 56, the transfer process may commence. After completion of the transfer, data can be read from active array 54 in the usual manner.

Figure 3:
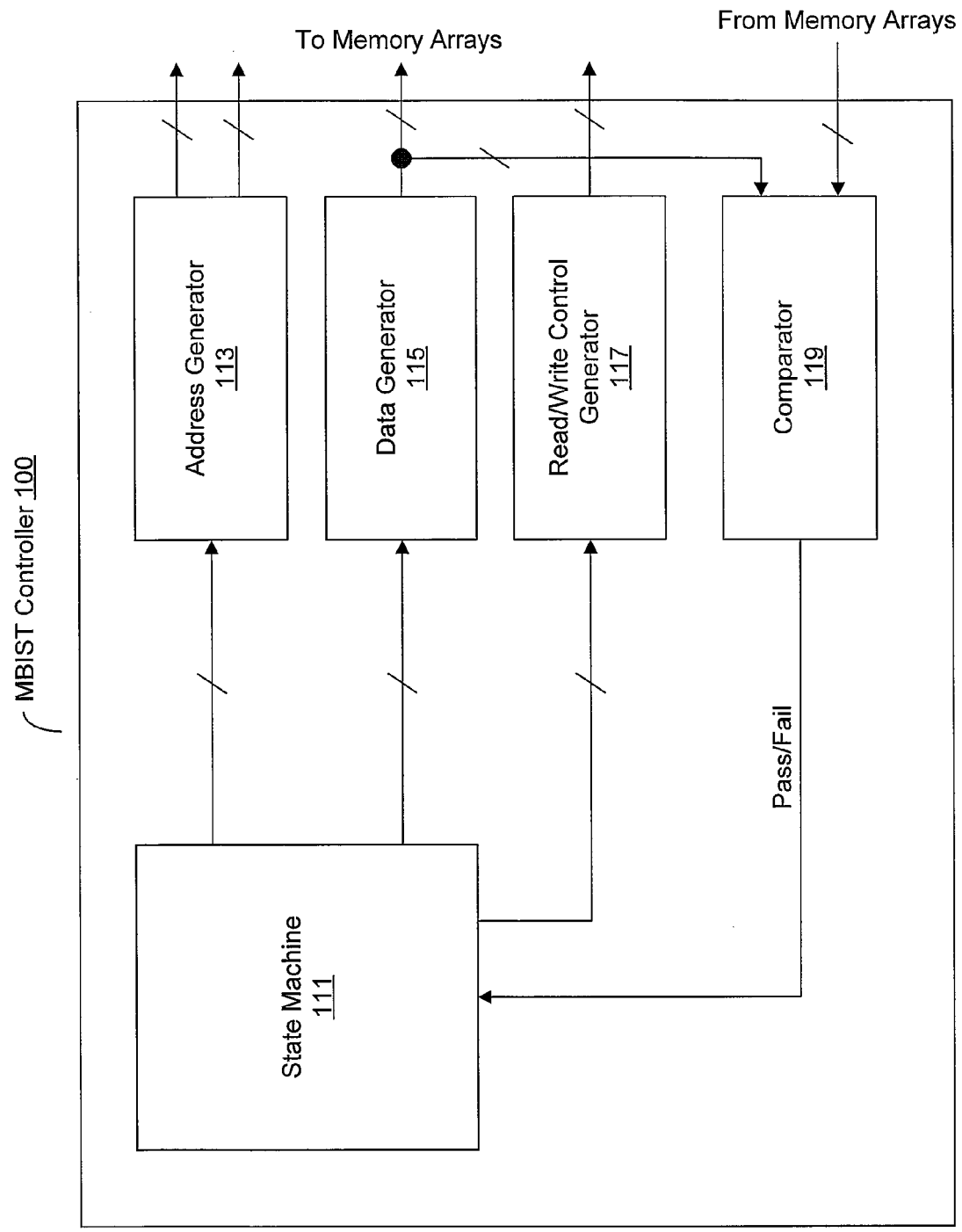
FIG. 3 is a block diagram of one embodiment of an MBIST controller implemented on the IC illustrated in FIG. 1.

FIG. 3 is a block diagram of one embodiment of an MBIST controller implemented on the IC illustrated in FIG. 1. In the embodiment shown, MBIST controller 100 includes a state machine 111, an address generator 113, a data generator 115, a read/write control generator 117, and a comparator 119. Each of these units will be now be explained in further detail.

State machine 111 is configured to generate test algorithms for testing each of the memories on the IC upon which it is implemented. Test algorithms generated by state machine 111 are based both on the physical organization of the memory array to be tested, the type of test to be conducted, and the type of faults that may be expected. Based on the physical organization of a memory array to be tested, state machine 111 may generate a test algorithm that is one of several different types of March tests.

The test algorithm generated by state machine 111 also includes information about patterns in which data is written to and read from the memory. The wide variety of test patterns available and the faults that may be detected by each will be appreciated by those skilled in the art. Examples of such patterns are the MATS patterns (MATS, MATS+, MATS++), Marching I/O, March A patterns (March A, March A+, March A++), March X, March Y, March SR+, 9N Linear pattern, 13N pattern, MovC pattern, Moving inversion. Various embodiments of state machine 111 may generate test algorithms using these or other memory test patterns. The types of faults that may be detected using these patterns include (but are not limited to) stuck-at faults, address decoder faults, transition faults, coupling faults, and so forth. These test algorithms may be used to test each of the memory arrays 102 shown in FIG. 1, and may also be used to test active array 54 of the 3D memory discussed in reference to FIG. 2.

State machine 111 is also be configured to generate a modified march algorithm for testing static array 52 as well as the function of transfer mechanism 56. The modified march algorithm generated by state machine 111 accounts for the fact that data cannot be directly read from static array 52. Thus, between each write to the static array and subsequent read of the active array, the algorithm generated by state machine 111 inserts a transfer operation, causing data to be transferred from static array 52 to active array 54. Furthermore, in test cycles subsequent to the first and previous to the last, the algorithm generated by state machine 111 is such that writes to static array 52 overlap with reads from active array 56. By overlapping reads and writes (which will be discussed further in reference to FIGS. 4 and 5), the modified March test may be conducted with essentially the same timing as a conventional March test. Thus, the modified March test may be conducted using any of the various algorithms discussed above. Furthermore, the modified March test may be conducted using a modified version of one of the various algorithms discussed above, and may depend on the desired test type as well as the physical organization of the static array.

Prior to conducting a test of static array 52, a test may be conducted of active array 54 in order to ensure it is functioning properly. Ensuring the integrity of active array 54 is necessary to verify the validity of data written to static array 52 and transferred therefrom by transfer mechanism 56. Testing of active array 54 may include performing a plurality of writes thereto and reads therefrom in accordance with a conventional March test.

Address generator 113 is coupled to receive information regarding the test algorithm from state machine 111. Address generator 113 is configured to generate addresses to which data will be written to or read from during testing, and is further configured to convey these addresses to the appropriate memory array during testing. In the embodiment shown, address generator 113 may be coupled to 3D memory array so as to concurrently convey separate addresses to static array 52 and active array 54. More particularly, address generator 113 is configured to concurrently convey an address for writing to static array 52 and a separate address reading from active array 54, in accordance with the overlapping reads and writes of a modified March test.

Data generator 115 is coupled to receive information regarding test algorithms from state machine 111. Responsive to receiving this information, data generator 115 is configured to generate data to be written to a memory array under test. The data may be generated based on a pattern that is part of the test algorithm, as discussed above. The patterns may include various sequences of logic 0's and logic 1's that may be written to a memory during testing. Furthermore, data may be generated for multiple reads and writes to each address of the memory during testing in accordance with the pattern used in the test algorithm. Data generator 115 is also configured to convey generated data to the target memory array during testing.

Based on information regarding the test algorithm received from state machine 111, read/write control generator 117 is configured to generate control signals to be conveyed to a memory array under test. Types of control signals generated may include column address strobe, row address strobe, write strobe, read strobe, bank select, and any other type of control signal that may be associated with the memory arrays implemented on the IC. Read/write control generator 117 conveys the appropriate signals as necessary to the memory array under test at the appropriate times and in accordance with the test algorithm an the physical organization of the memory. Read/write control generator 117 may also be configured to generate a transfer strobe to be conveyed to the 3D memory 50 in order to initiate the transfer of data from static array 52 to active array 54.

Comparator 119 is configured to receive data from both data generator 115 and from the memory array under test. Data received from the memory array under test is compared with expected data (based on the data received from data generator 115) to determine a pass/fail status of the memory array. The comparator may provide signals to the state machine indicating whether or not a particular test passed or failed. When testing static array 52 of 3D memory 50, a failure of a test may indicate the presence of a defect in either static array 52 or the transfer mechanism 56.

Figure 4:
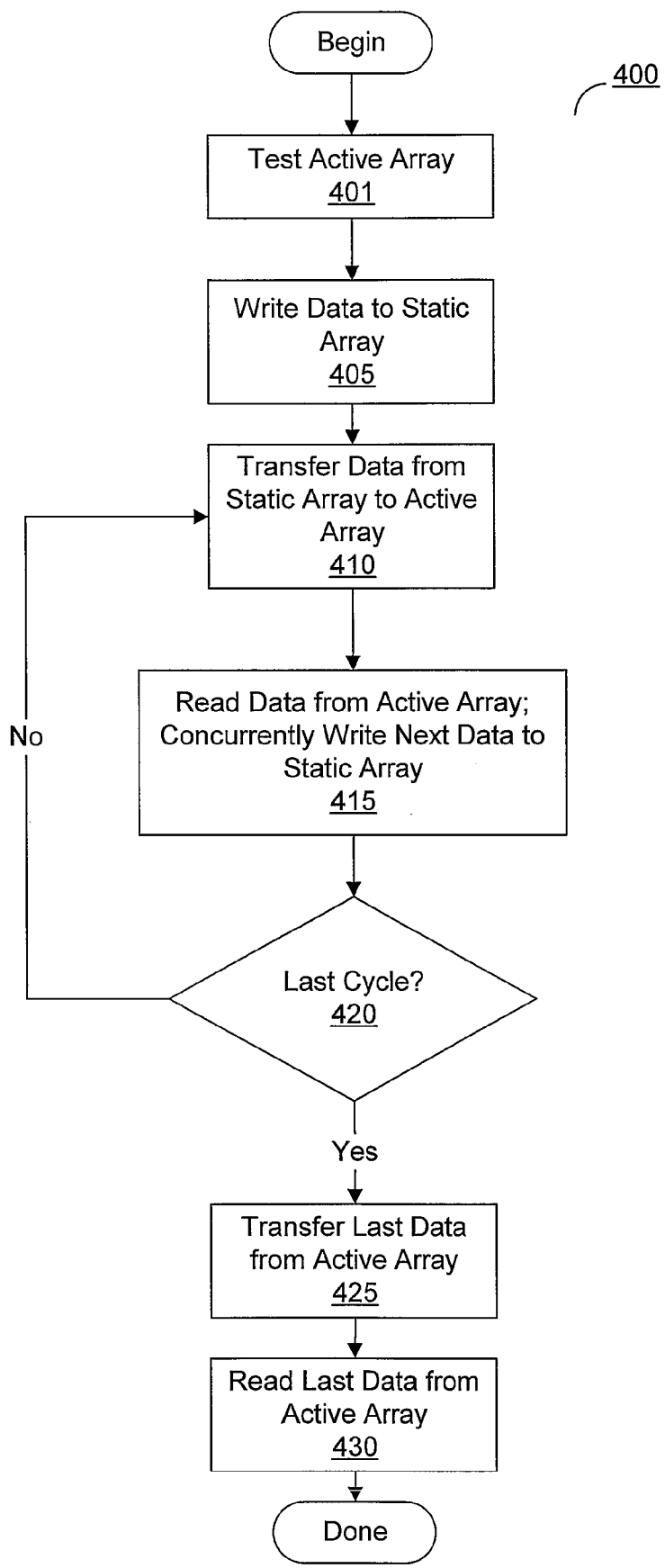
FIG. 4 is a flow diagram illustrating a method of testing a 3D memory array.

Turning now to FIG. 4, a flow diagram illustrating a method of testing a 3D memory array is shown. Method 400 begins with the testing of active array (401). Testing of the active array comprises performing a plurality of writes thereto and reads therefrom. More particularly, the testing conducted in 401 ensures that data written to the active array can be read back as originally written.

Upon completion of the active array test, the testing proceeds by conducting a first write of data to the static array (405). After the first write operation is complete, data is transferred from the static array to the active array (410). Upon completion of the transfer, a next data block (which may be one or more bytes of data in a pattern determined by the data generator as discussed above) is written to the static array, while concurrent with writing the next data, the data that was previously transferred to the active array is read from the active array (415). If the data written to the static array is not part of a last cycle of data to be written and read (420, No), the method returns to the transfer operation of item 410. This method may repeat for any number cycles that are necessary to fully test the static array (as well as the transfer mechanism) in accordance with the chosen test algorithm, with writes to the static array overlapping with concurrent reads of the active array.

Figure 5:
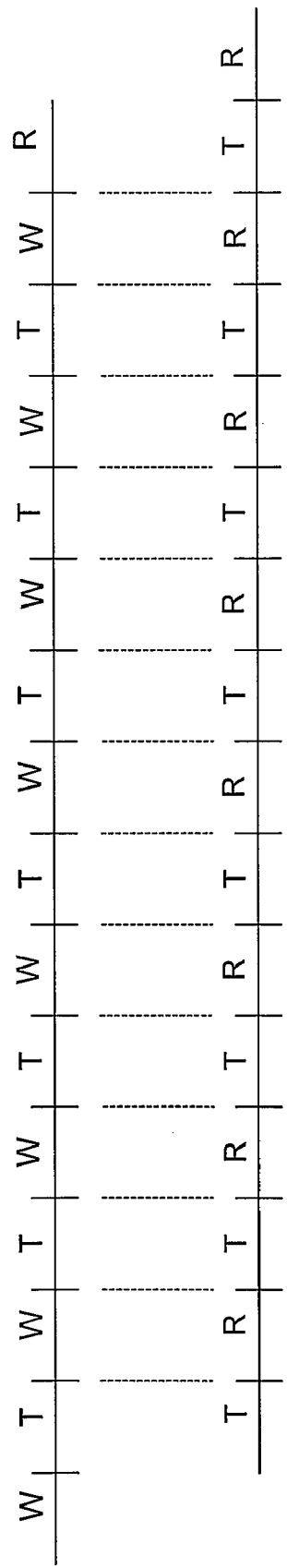
FIG. 5 is a drawing illustrating the overlap of static array writes and active array reads performed in testing one embodiment of a 3D memory array.

The timing of the overlapping reads and writes performed during a modified March test is illustrated further in FIG. 5. As can be seen in FIG. 5, for each write to the static array subsequent to the first write, a read operation is performed concurrently therewith. Transfer operations occur after each write of data to the static array and prior to each read of data from the active array.

If the data written to the static array is the last data block of the test (420, yes), the method proceeds with the transfer of the last data from the static array to the active array (425). Following this final transfer, a final read of data from the active array is performed (430), and the method is then complete.

Although not explicitly discussed in the description of FIGS. 4 and 5, the testing methods also include checking each block of data read from the active array and comparing it to expected data. As noted above, comparator 119 of MBIST controller 100 may perform this function. More particularly, data that is written to the static array may also be written to comparator 119. On the next cycle, after the data has been written, transferred and read, comparator 119 compares the data read from the active array with that originally written to the static array. If comparator 119 determines that the data read from the active array matches that originally written to the static array, a pass indication may be provided to state machine 111. If the data read from the active array does not match that which was written to the static array, a fail indication is provided to state machine 111.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method of testing a 3-dimensional (3D) memory including an active array and a static array, the method comprising:
    in a first cycle, writing data to the static array of the 3D memory, wherein the static array includes at least one write port and does not include a read port;
    transferring data from the static array to the active array; and
    reading data from the active array, wherein the 3D memory is configured such that data stored in the static array is accessible only via a transfer to and a read from the active array;
    for a plurality of subsequent cycles, writing data to the static array, transferring data from static array to the active array, and reading data from the active array, wherein said writing data for each subsequent cycle is performed concurrently with reading data for a previous cycle; and
    wherein the active array includes a write port configured to enable writes to the active array, a read port configured to enable reads from the active array, and a transfer port configured to enable the active array to receive data transferred from the static array via a transfer mechanism; and wherein the static array includes a write port configured to enable writes to the static array, and a transfer port configured to enable data to be conveyed from the static array to the active array via a transfer mechanism.

2. The method as recited in claim 1, wherein said testing comprises performing a modified March test.

3. The method as recited in claim 2, wherein the modified March test includes a transfer cycle between each write and subsequent read.

4. The method as recited in claim 1 further comprising comparing data read from the active array to expected data for the first cycle and each of the plurality of subsequent cycles.

5. The method as recited in claim 4 further comprising generating a pass/fail indication based on said comparing.

6. The method as recited in claim 1, wherein said writing, transferring and reading in the first cycle and the plurality of subsequent cycles comprise a test of the static array, and wherein the method further comprises testing the active array prior to testing the static array.

7. The method as recited in claim 6, wherein said testing the active array comprises performing a plurality of writes to the active array and reads from the active array.

8. An integrated circuit comprising:
    a three-dimensional (3D) memory including a static array and an active array, wherein the static array includes at least one write port and does not include a read port, wherein the 3D memory is configured such that data stored in the static array is accessible only via a transfer to and a read from the active array; and
    a memory built-in self-test (MBIST) controller, wherein the MBIST controller is configured to conduct tests of the static array, wherein testing of the static array comprises:
        in a first cycle, writing data to the static array;
        transferring data from the static array to the active array; and reading data from the active array;
for a plurality of subsequent cycles, writing data to the static array; transferring data from the static array to the active array, and reading data from the active array, wherein said writing data for each subsequent cycle is performed concurrently with reading data for a previous cycle; and
wherein the active array includes a write port configured to enable writes to the active array, a read port configured to enable reads from the active array, and a transfer port configured to enable the active array to receive data transferred from the static array via a transfer mechanism; and wherein the static array includes a write port configured to enable writes to the static array, and a transfer port configured to enable data to be conveyed from the static array to the active array via a transfer mechanism.

9. The integrated circuit as recited in claim 8, wherein testing the static array comprises performing a modified March test.

10. The integrated circuit as recited in claim 9, wherein the modified March test includes a transfer cycle between each write and subsequent read.

11. The integrated circuit as recited in 8, wherein the MBIST controller is configured to test the active array prior to testing the static array, wherein said testing the active array comprises performing a plurality of writes to the active array and reads from the active array.

12. The integrated circuit as recited in claim 8, wherein the MBIST controller includes a state machine, wherein the state machine is configured to generate test algorithms for testing the 3D memory.

13. The integrated circuit as recited in claim 12, wherein the MBIST controller includes an address generator coupled to the state machine, wherein the address generator is configured to generate addresses corresponding to locations in the 3D memory that are to be written to or read from during testing based on a generated test algorithm.

14. The integrated circuit as recited in claim 13, wherein, during testing of the static array, the address generator is configured to concurrently convey a write address to the static array and a read address to the active array.

15. The integrated circuit as recited in claim 12, wherein the MBIST controller includes a data generator coupled to the state machine, wherein the data generator is configured to generate data to be written to the 3D memory during testing.

16. The integrated circuit as recited in claim 12, wherein the MBIST controller includes a comparator coupled to the state machine, wherein the comparator is configured to compare data read from the 3D memory to expected data, and wherein the comparator is coupled to provide a pass/fail signal to the state machine based on comparisons of the data read from the 3D memory to the expected data.

17. The integrated circuit as recited in claim 12, wherein the MBIST controller includes a read/write control generator coupled to the state machine, wherein the read/write control generator is configured to generate read and write control signals based on a test algorithm generated by the state machine, and wherein the read/write control generator is further configured to generate a transfer strobe signal to cause data to be transferred from the static array to the active array.

18. A memory built-in self-test (MBIST) controller comprising:
means for writing data to a static array of a three dimensional (3D) memory, wherein the 3D memory includes the static array and an active array;
means for causing data stored in the static array to be transferred to the active array; and
means for reading data from the active array;
wherein the MBIST controller is configured to:
in a first cycle:
write data to the static array;
transfer data from the static array to the active array; and
read data from the active array; and
for a plurality of subsequent cycles:
write data to the static array;
transfer data from the active array to the static array;
read data from the active array, wherein writing data for each subsequent cycle is performed concurrently with reading data for a previous cycle; and
wherein the active array includes a write port configured to enable writes to the active array, a read port configured to enable reads from the active array, and a transfer port configured to enable the active array to receive data transferred from the static array via a transfer mechanism; and wherein the static array includes a write port configured to enable writes to the static array, and a transfer port configured to enable data to be conveyed from the static array to the active array via a transfer mechanism.

* * * * *